(12) United States Patent
Kim et al.

(10) Patent No.: US 7,200,181 B2
(45) Date of Patent: Apr. 3, 2007

(54) APPARATUS AND METHOD FOR GENERATING AND DECODING CODES IN A COMMUNICATION SYSTEM

(75) Inventors: Min-Goo Kim, Suwon-shi (KR); Jae-Sung Jang, Kwachon-shi (KR); Sang-Hyuck Ha, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 944 days.

(21) Appl. No.: 10/080,262

(22) Filed: Feb. 19, 2002

(65) Prior Publication Data

US 2002/0114401 A1 Aug. 22, 2002

(30) Foreign Application Priority Data

Feb. 16, 2001 (KR) .................................. 2001-7916

(51) Int. Cl.
*H04L 23/02* (2006.01)
*H03M 13/03* (2006.01)

(52) U.S. Cl. ....................... 375/262; 714/790
(58) Field of Classification Search ................ 375/295, 375/262, 341; 714/755, 790, 792
See application file for complete search history.

(56) References Cited

U.S. PATENT DOCUMENTS

| | | | | |
|---|---|---|---|---|
| 5,381,425 A * | 1/1995 | Bitzer et al. | ................. | 714/793 |
| 5,784,388 A * | 7/1998 | Knox | ................. | 714/756 |
| 6,202,189 B1 * | 3/2001 | Hinedi et al. | ................. | 714/786 |
| 6,308,294 B1 * | 10/2001 | Ghosh et al. | ................. | 714/751 |
| 6,370,669 B1 * | 4/2002 | Eroz et al. | ................. | 714/774 |
| 6,493,815 B1 * | 12/2002 | Kim et al. | ................. | 711/217 |
| 6,601,214 B1 * | 7/2003 | Hammons, Jr. | ................. | 714/790 |
| 6,611,940 B1 * | 8/2003 | Markarian et al. | ................. | 714/790 |
| 6,668,350 B1 * | 12/2003 | Kim | ................. | 714/759 |
| 6,744,744 B1 * | 6/2004 | Tong et al. | ................. | 370/320 |

(Continued)

FOREIGN PATENT DOCUMENTS

EP 1 199 835 A2 4/2002

(Continued)

OTHER PUBLICATIONS

Kim et al., Quasi-Complementary Turbo Codes (QCTC) for Applications in High-Data-Rate Systems, Apr. 22-25, 2003, 57th IEEE Semiannual Vehicular Technology Conference, vol. 4, pp. 2381-2385.*

(Continued)

*Primary Examiner*—Emmanuel Bayard
*Assistant Examiner*—Lawrence B Williams
(74) *Attorney, Agent, or Firm*—The Farrell Law Firm

(57) ABSTRACT

An apparatus generates quasi-complementary turbo codes in a communication system. The apparatus includes a turbo encoder, an interleaver for interleaving symbols output from the turbo encoder according to a given rule, and a code generator for generating the quasi-complementary turbo codes by puncturing and repeating the interleaved symbols from the interleaver. Further, an apparatus decodes quasi-complementary turbo codes in the communication system. The decoding apparatus includes a code decoder for generating code symbols according to a code rate transmitted through depuncturing sub-codes of quasi-complementary turbo codes transmitted from a transmitter and soft combining the sub-codes, a deinterleaver for deinterleaving the symbols output from the code decoder, and a turbo decoder for decoding an output of the deinterleaver.

16 Claims, 7 Drawing Sheets

U.S. PATENT DOCUMENTS

| | | | |
|---|---|---|---|
| 6,877,130 B2 | 4/2005 | Kim et al. | |
| 6,980,605 B2 * | 12/2005 | Gatherer et al. | 375/340 |
| 2002/0129314 A1 * | 9/2002 | Kim et al. | 714/755 |
| 2002/0144205 A1 * | 10/2002 | Kim et al. | 714/752 |
| 2002/0152445 A1 * | 10/2002 | Kim et al. | 714/786 |
| 2004/0068687 A1 * | 4/2004 | Kim et al. | 714/755 |
| 2005/0160347 A1 * | 7/2005 | Kim et al. | 714/776 |

FOREIGN PATENT DOCUMENTS

| | | |
|---|---|---|
| EP | 1 231 735 A2 | 8/2002 |
| EP | 1 231 737 A1 | 8/2002 |
| WO | WO 01/91355 | 11/2001 |

OTHER PUBLICATIONS

European Search Report dated Feb. 6, 2003, issued in a counterpart application, namely, Appln. No. 02003682.8.

3rd Generation Partnership Project (3GPP); Technical Specification Group Radio Access Network Multiplexing and Channel Coding (FDD), Oct. 1999.

Combined Search and Examination Report dated Oct. 30, 2002 issued in a counterpart application, namely, Appln. No. GB 0203771.1.

Search and Examination Report dated May 29, 2003 issued in a counterpart application, namely Appln. No. GB 0203771.1.

* cited by examiner

APPARATUS AND METHOD FOR GENERATING AND DECODING CODES IN A COMMUNICATION SYSTEM

PRIORITY

This application claims priority to an application entitled "Apparatus and Method for Generating and Decoding Codes in a Communication System" filed in the Korean Industrial Property Office on Feb. 16, 2001 and assigned Serial No. 2001-7916, the contents of which are hereby incorporated by reference.

BACKGROUND OF THE INVENTION

1. Field of the Invention

The present invention relates generally to an code generation apparatus in a data communication system, and in particular, to an apparatus and method for generating complementary turbo codes considering a characteristic of turbo codes in an ARQ (Automatic Repeat reQuest) packet communication system or a general communication system supporting ARQ scheme.

2. Description of the Related Art

In general, a system supporting a hybrid ARQ scheme (hereinafter, referred to as a "HARQ system") uses a soft combining technique in order to improve its throughput, and the soft combining technique is divided into a packet diversity combining technique and a packet code combining technique. The two combining techniques are both called "soft packet combining". Compared with the packet code combining technique, the packet diversity combining technique is sub-optimal in terms of performance, but frequently used because of its implementation simplicity when performance loss is not significant factor in system design.

The packet code combining technique is utilized in a packet transmission system in order to increase its throughput. The packet code combining technique transmits varying codes having a code rate R for each packet transmitted. Upon a receiver detecting an error in the received packet after decoding, the receiver stores the failed packet rather than discarding it, and then soft-combines the stored packet with a packet retransmitted by the transmitter. Here, different codes may be used for the retransmitted packet. That is, upon receiving N packets having a code rate R, the packet code combining technique converts the code rate to an effective code rate R/N using the packets before decoding, thereby to obtain a coding gain.

On the other hand, the packet diversity combining technique transmits the same codes having a code rate R for each packet transmitted. Upon detecting at a receiver an error in the received packet after decoding, the receiver stores the failed packet rather than discarding it, and then soft-combines the stored packet with a packet retransmitted from the transmitter. In all cases, the same codes are used for the retransmitted packet. Therefore, the packet diversity combining technique can be regarded as a Symbol Energy Averaging process in a random channel, and uses only an interference power reduction effect attained by averaging soft output of received symbols, and a diversity gain provided in a diversity channel by transmitting a plurality of symbols in a fading channel. In contrast, the packet code combining technique has a supplemental coding gain based on a code structure in addition to the diversity gain.

In the meanwhile, a turbo encoder generating the turbo code will be described hereinbelow. In the case of a turbo encoder with $R=\frac{1}{5}$, the turbo encoder generates information symbols X, first parity symbols $Y_0$, $Y_0'$ and second parity symbols $Y_1$, $Y_1'$ by encoding input information symbols. The turbo encoder is comprised of two constituent encoders and one interleaver. The first parity symbols $Y_0$ and $Y_0'$ are output from a first constituent encoder by encoding the input information symbols and the second parity symbols $Y_1$ and $Y_1'$ from a second constituent encoder by encoding the information symbols interleaved through the interleaver. In detail, the $Y_0$ is a first row of parity symbols generated from a first constituent encoder, and the $Y_0'$ is a second row of parity symbols generated from the first constituent encoder.

To date, most of the packet communication systems have used the packet diversity combining technique because of its implementation simplicity, and in particular, the synchronous IS-2000 system and the asynchronous UMTS system employ the packet diversity combining technique for these same reasons. However, most of the existing packet communication systems have used convolutional codes, and when using the convolutional codes having a low code rate R, the systems cannot provide a high diversity gain even though they use the packet diversity combining technique. That is, in the case where a system using $R=\frac{1}{3}$ convolutional codes supports the ARQ scheme, a performance difference between the packet diversity combining technique and the packet code combining technique is not considerable, and therefore the system uses the packet diversity combining technique. However, when using turbo codes as forward error correction codes (FEC), a different technique is required. This is because the turbo codes are designed to have their performance approach the Shannon Channel Capacity Limit by iterative decoding, and have an obvious performance difference according to the code rate, unlike the convolutional codes. It is therefore desirable to utilize the packet code combining technique in a packet communication system that uses turbo codes, in order to improve system performance.

SUMMARY OF THE INVENTION

It is, therefore, an object of the present invention to provide an apparatus and method for generating and decoding complementary turbo codes considering the characteristics of turbo codes in a communication system.

It is another object of the present invention to provide an apparatus and method for generating quasi-complementary turbo codes (QCTC) in a communication system.

It is further another object of the present invention to provide an apparatus and method for decoding quasi-complementary turbo codes in a communication system.

To achieve the above and other objects, the present invention provides an apparatus for generating quasi-complementary turbo codes in a communication system. The apparatus includes a turbo encoder, an interleaver for interleaving symbols output from the turbo encoder according to a give rule, and a code generator for generating the quasi-complementary turbo codes by puncturing and repeating the interleaved symbols from the interleaver.

To achieve the above and other objects, the present invention provides an apparatus for decoding quasi-complementary turbo codes in a communication system. The decoding apparatus includes a code decoder for generating code symbols according to a code rate transmitted through depuncturing sub-codes of quasi-complementary turbo codes transmitted from a transmitter and soft combining the sub-codes, a deinterleaver for deinterleaving the symbols output from the code decoder, and a turbo decoder for decoding an output of the deinterleaver.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

The present invention provides a method for utilizing quasi-complementary turbo codes (QCTC) regardless of a variation in a code length in a system that supports channel interleaving using the quasi-complementary turbo codes, or in a system that requires the quasi-complementary turbo codes having a variety of code rates. A QCTC is defined as a complementary code generated using a turbo code. The QCTC is not a perfect complementary code as noted from the term "quasi" because a sub-code includes repeated symbols and has a different characteristic such as error correcting capability from another sub-code.

Figure 1:
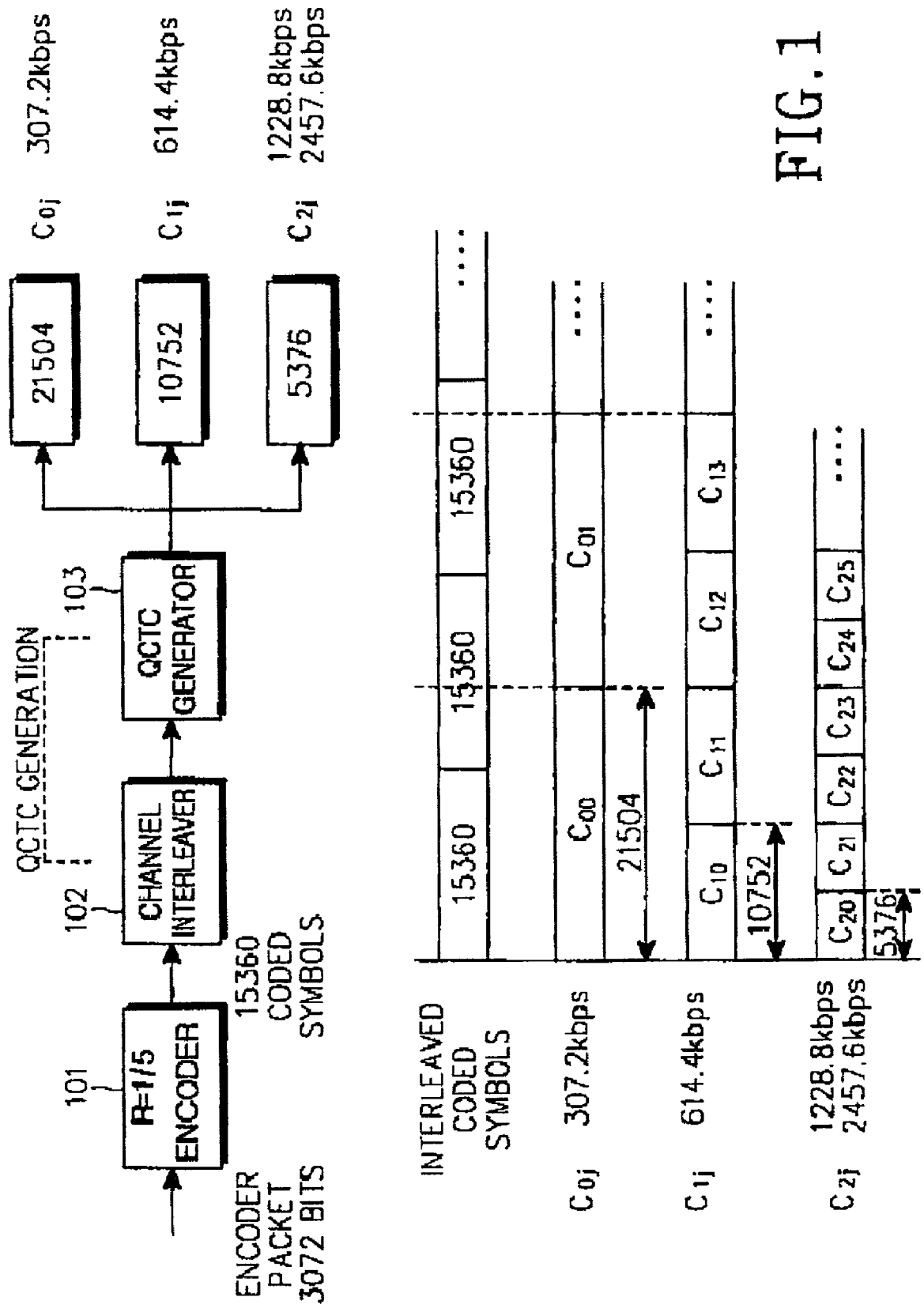
FIG. 1 illustrates a structure of a QCTC generation apparatus according to an embodiment of the present invention.

FIG. 1 illustrates a structure of a QCTC generation apparatus according to an embodiment of the present invention, in which symbol repetition and puncturing used in the quasi-complementary turbo codes(QCTC) generation apparatus is performed after channel interleaving.

Referring to FIG. 1, an encoder 101 encodes an input encoder packet into coded symbols. Here, a convolutional encoder or a turbo encoder can be typically used for encoder 101. In an example used herein, it will be assumed that a code rate of encoder 101 is R=⅕. Therefore, encoder 101 receives 3072 information bits and outputs 15360 coded symbols. A channel interleaver 102 interleaves the coded symbols output from encoder 101 according to a given rule. Here, if encoder 101 is a turbo encoder, interleaver 102 independently interleaves a codeword symbol X, and parity symbols $Y_0$, $Y_1$, $Y_0'$, and $Y_1'$ based on the property of the turbo encoder. A QCTC generator (or a QCTC puncturing/repetition block) 103 generates quasi-complementary turbo codes by puncturing and repeating the interleaved symbols provided from channel interleaver 102. As above, the channel interleaver 102 and the QCTC generator 103 perform the QCTC generation process.

As illustrated, if the number of interleaved code symbols is 15,360 and the data rate (or code rate) of sub-codes is given as 307.2 kbps, the QCTC generator 103 generates the first sub-code having 21,504 symbols by taking the 15,360 interleaved code symbols and repeating part of the first half of the interleaved code symbols. If the data rate is 614.4 kbps, the QCTC generator 103 generates the first sub-code by taking the first 10,752 code symbols from the first half of the interleaved code symbols. And if the data rate is 1228.8 kbps or 2457.6 kbps, the QCTC generator 103 generates the first sub-code by taking the first 5,376 code symbols from the interleaved code symbols.

Here, the channel interleaver must be specifically designed in order to generate the quasi-complementary turbo codes(or sub-codes) This is due to the fact that the 5 symbols, i.e. the codeword symbol X and the parity symbols $Y_0$, $Y_1$, $Y_0'$ and $Y_1'$, output from channel encoder 101, are dispersed after being subjected to channel interleaving. It is difficult to implement a system to use the dispersed symbols as inputs to the puncturing and repetition block for generating the quasi-complementary turbo codes, and it is not easy to generate sub-codes satisfying the characteristics of a QCTC with the mixed symbols of X, $Y_0$, $Y_1$, $Y_0'$, and $Y_1'$. In order to solve this problem, the present invention provides a method for generating the quasi-complementary turbo codes by a specific technique regardless of the code rate of the sub-codes.

Figure 2:
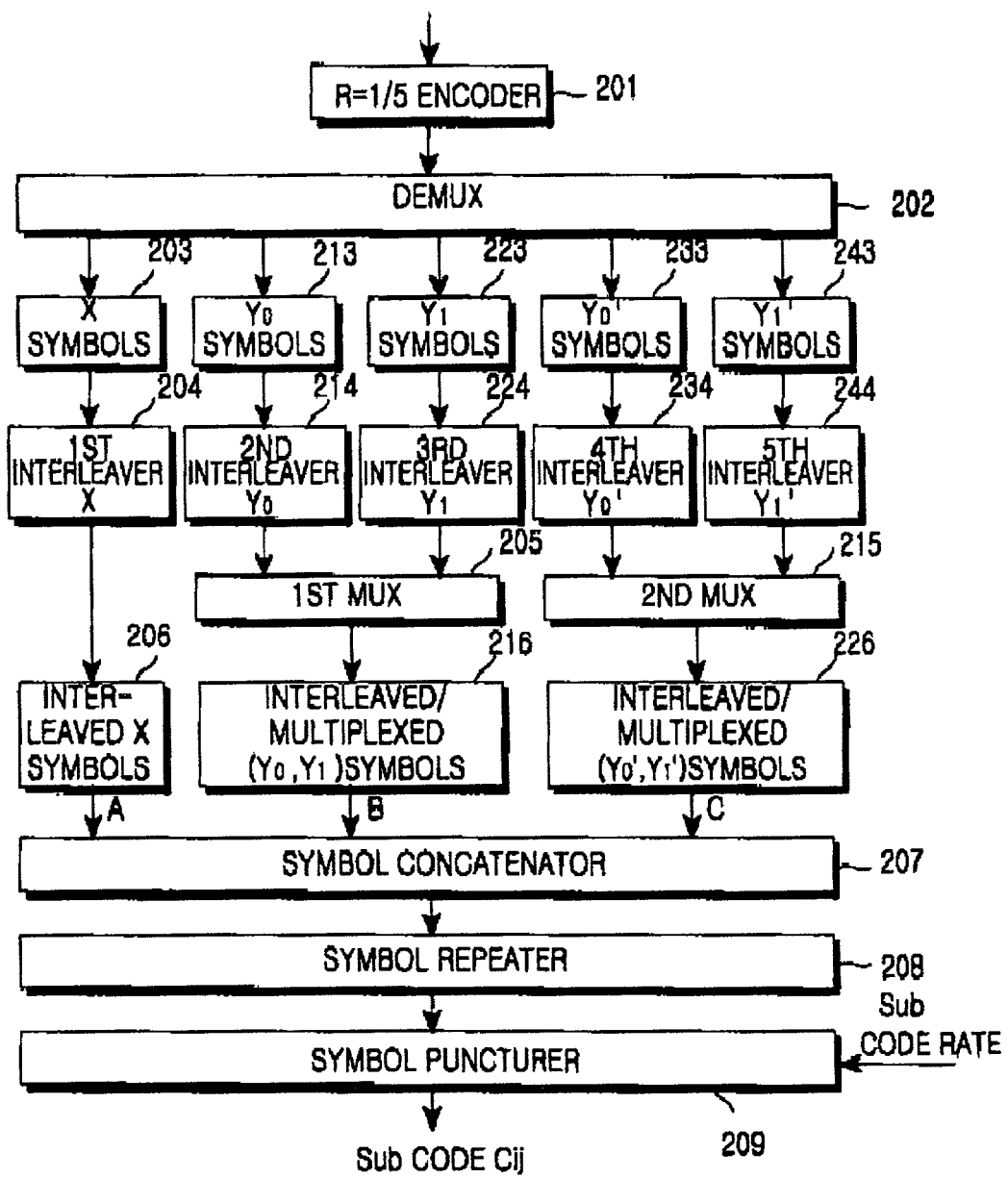
FIG. 2 illustrates a procedure for generating quasi-complementary turbo codes according to an embodiment of the present invention.

FIG. 2 illustrates a procedure for generating quasi-complementary turbo codes according to an embodiment of the present invention. Referring to FIG. 2, an encoder 201 encodes an input encoder packet into symbols. The encoder 201 uses mother codes with various code rates. The mother codes are determined by the system using them. As per an example, R=⅕ turbo codes are used herein as the mother codes. Then, the encoder 201 generates information symbols X, first parity symbols $Y_0$ and $Y_0'$ and second parity symbols $Y_1$ and $Y_1'$ by encoding input information symbols. The first parity symbols $Y_0$ and $Y_0'$ are output from a first constituent encoder and the second parity symbols $Y_1$ and $Y_1'$ from a second constituent encoder. The first and second constituent encoders (not shown) are contained in encoder 201. The primary parity symbols $Y_0$ and $Y_1$ from the first and second constituent encoders have a higher transmission priority than the secondary parity symbols $Y_0'$ and $Y_1'$.

A demultiplexer 202 demultiplexes 5 symbols, including a codeword symbol X and parity symbols $Y_0$, $Y_1$, $Y_0'$ and $Y_1'$, output from channel encoder 201 into 5 groups. That is, codeword symbols X and the parity symbols $Y_0$, symbols $Y_1$, symbols $Y_0'$ and symbols $Y_1'$ are sequentially demultiplexed and then provided to sub-block interleavers 204, 214, 224, 234 and 244, respectively. The sub-block interleavers 204, 214, 224, 234 and 244 randomly permute the sequences output from the demultiplexer 202 by sub-block interleaving. Various sub-block interleaving methods are available as long as the following condition is satisfied.

(Condition) Interleaved code symbols are partially punctured in such a way that the puncturing pattern of code symbols before interleaving has a uniform puncturing distance.

The reason for satisfying the above condition is that when a predetermined number of symbols are punctured from the respective codeword symbol sets X, $Y_0$, $Y_1$, $Y_0'$, and $Y_1'$, the distance between punctured symbols in the codeword symbols before sub-block interleaving must be equal to achieve optimum turbo code performance. In other words, when puncturing is applied to turbo codes, uniformity is a significant factor that determines the performance of the turbo codes. In accordance with the present invention, sub-block interleaving applies independently to the code symbols X, $Y_0$, $Y_0'$, $Y_1$, and $Y_1'$. Uniform puncturing in each interleaver output maintained an equal distance between punctured code symbols in encoder output. Therefore, it can be concluded that channel interleaving must be chosen so that puncturing in interleaved code symbols can maintain a uniform puncturing distribution in channel encoder output.

Such channel interleaving methods include (BR) (Bit Reversal Order) interleaving and PBRO (Partial Bit Reversal Order) interleaving. The BRO interleaving is practicale only if the number of input information bits to an encoder and the number of symbols in the codeword symbols sets X, $Y_0$, $Y_0'$, $Y_1$, and $Y_1'$ generated from a mother code are powers of 2, that is, $2^m$, wherein m is a parameter to make a block size of sub block interleaver such as block size $N=2^m*J$. The PBRO interleaving was designed to satisfy the afore-stated condition even if the number of symbols in the respective codeword symbol sets X, $Y_0$, $Y_0'$, $Y_1$, and $Y_1'$ is not a power of 2 in order to overcome the limitation of the BRO interleaving. A detailed description of this sub-block channel interleaving will be avoided here and it is to be noted that any channel interleaving method can be implemented in the present invention as long as it satisfies the above condition.

The codeword symbols randomized by the sub-block interleaving are applied to associated blocks. Here, the interleaved information symbol set X 206 output from first interleaver 204 is applied directly to a symbol concatenator (or symbol combiner) 207. The interleaved parity symbols $Y_0$ and $Y_1$, from the second and third interleavers 214 and 224, respectively, are input to a first multiplexer (MUX) 205 and the interleaved parity symbols $Y_0'$ and $Y_1'$ from the fourth and fifth interleavers 234 and 244, respectively, are provided to a second MUX 215. The first MUX 205 multiplexes the interleaved parity symbols $Y_0$ and $Y_1$, and provides its output to the sequence concatenator 207. The second MUX 215 multiplexes the interleaved parity symbols $Y_0'$ and $Y_1'$, and provides its output to symbol concatenator 207. The interleaved codeword symbols output from the interleavers are rearranged and then divided into three sub-groups, 206, 216 and 226.

The above-described process, which is essential to generation of QCTCs according to the present invention, will be described in more detail. As shown in FIG. 2, information symbols X form an independent sub-group without passing through multiplexing after sub-block interleaving. Let the sub-block interleaved symbols be $Sb_1\_X$, which can be expressed as $$Sb_1\_X(1), Sb_1\_X(2), Sb_1\_X(3), Sb_1\_X(4) \quad (1)$$

where $Sb_1\_X(1)$ indicates the first symbol output from the first interleaver 204. $Sb_1\_X$ is referred to as sequence A.

Then, the interleaved codeword symbols $Y_0$ and $Y_1$ output from the second and third interleavers 214 and 224 are grouped into one sub-group. If the codeword symbols $Y_0$ are $Sb_1\_Y_0$, $Sb_1\_Y_0$ can be expressed as $$Sb_1\_Y_0(1), Sb_1\_Y_0(2), Sb_1\_Y_0(3), Sb_1\_Y_0(4) \quad (2)$$

where $Sb_1\_Y_0(1)$ indicates the first code symbol output from the second interleaver 214. If the code symbols $Y_1$, are $Sb_1\_Y_1$, $Sb_1\_Y_1$ can be expressed as $$Sb_1\_Y_1(1), Sb^1\_Y_1(2), Sb_1\_Y_1(3), Sb_1\_Y_1(4) \quad (3)$$

where $Sb_1\_Y_1(1)$ and $Sb_1\_Y_1(2)$ indicate the first and second code symbols, respectively, output from the third interleaver 224. After multiplexing the code symbols $Y_0$ and $Y_1$, in MUX 205 the output of first MUX 205 would be, $$Sb_1\_Y_0(1), Sb_1\_Y_1(1), Sb_1\_Y_0(2), Sb_1\_Y_1(2),$$
$$Sb_1\_Y_0(3), Sb_1\_Y_1(3) \quad (4)$$

These multiplexed symbols are referred to as sequence B.

The reason for multiplexing the interleaved code symbols $Sb_1\_Y_0$ and $Sb_1\_Y_1$ is that when M successive symbols are punctured in the sequence B irrespective of the first half or second half of the sequence B, the number of punctured symbols in $Sb_1\_Y_0$ is equal to that of punctured symbols in $Sb_1\_Y_1$, only if M is an even number. If M is an odd number, the difference between the numbers of punctured symbols in $Sb_1\_Y_0$ and in $Sb_1\_Y_1$, is only 1. The multiplexing always satisfies the QCTC characteristic that the number of punctured parity symbols $Y_0$ is equal to that of punctured parity symbols $Y_1$.

In the same manner, the interleaved code symbols $Y_0'$ and $Y_1'$ output from the fourth and fifth interleavers 234 and 244 are grouped into one sub-group. If the code symbols $Y_0'$ and $Y_1'$ are $Sb_1\_Y_0'$ and $Sb_1\_Y_1'$, $Sb_1\_Y_0'$ and $Sb_1\_Y_1'$ can be expressed as $$Sb_1\_Y_0'(1), Sb_1\_Y_0'(2), Sb_1\_Y_0'(3), Sb_1\_Y_0'(4) \quad (5)$$

and $$Sb_1\_Y_1'(1), Sb_1\_Y_1'(2), Sb_1\_Y_1'(3), Sb_1\_Y_1'(4) \quad (6)$$

Then, the output of second MUX 215 is $$Sb_1\_Y_0'(1), Sb_1\_Y_1'(1), Sb_1\_Y_0'(2), Sb_1\_Y_1'(2),$$
$$Sb_1\_Y_0'(3), Sb_1\_Y_1'(3) \quad (7)$$

These multiplexed symbols are referred to as sequence C.

The reason for multiplexing the interleaved code symbols $Sb_1\_Y_0'$ and $Sb_1\_Y_1'$ is that when M successive symbols are punctured in the sequence C irrespective of the first half or second half of the sequence C, the number of punctured symbols in $Sb_1\_Y_0'$ is equal to that of punctured symbols in $Sb_1\_Y_1'$ only if M is an even number. If M is an odd number, the difference between the numbers of punctured symbols in $Sb_1\_Y_0'$ and in $Sb_1\_Y_1'$ is only 1. The multiplexing always satisfies the QCTC characteristic that the number of punctured parity symbols $Y_0'$ is equal to that of punctured parity symbols $Y_1'$.

The symbol concatenator 207 sequentially concatenates sequences A, B and C of the first, second, and third sub-groups and generates a symbol sequence [A:B:C].

$$[A:B:C]=[Sb_1\_X(1), Sb_1\_X(2), Sb_1\_X(3), \ldots$$
$$][Sb_1\_Y_0(1), Sb_1\_Y_1(1), Sb_1\_Y_0(2), Sb_{1_3}Y_1(2),$$
$$\ldots ][Sb_1\_Y_0'(1), Sb_1\_Y_1'(1), Sb_1\_Y_0'(2), Sb_1\_$$
$$Y_1'(2), \ldots] \quad (8)$$

As seen from the above formula, information symbols are placed first, followed by alternating parity symbols $Y_0$ and $Y_1$, and then by alternating parity symbols $Y_0'$ and $Y_1'$ in the sequence [A:B:C]. This symbol arrangement assumes a very significant meaning in QCTC generation, which will be described below.

Puncturing should be carried out to generate a sub-code with a code rate from the turbo code of (8). The puncturing is defined by a "QCTC". The QCTC should have the following characteristics.

(1) Information symbols precede all other code symbols in transmission. As the code rate of sub-codes becomes closer to "1", this characteristic becomes more important.

(2) A puncturing pattern is formed so that the number of parity symbols output from each constituent encoder (a first constituent encoder and a second constituent encoder) is equal or their difference in number is minimum.

(3) The number of punctured symbols in the parity symbols $Y_0$ and $Y_0'$ is determined such that the code rate of the first constituent encoder is always less than 1. That is, the performance of turbo codes is ensured when at least one parity symbol $Y_0$ or $Y_0'$ exists.

(4) The distance between punctured symbols in a QCTC resulting from puncturing is equal.

(5) A turbo code produced by combining QCTCs assumes the characteristics of a quasi-complementary code.

A QCTC with a sub-code code rate, which is generated by puncturing or pruning as many symbols as necessary from the end of the symbol sequence [A:B:C], satisfies the above five characteristics. In other words, an intended sub-code of a QCTC is generated by repeating and puncturing as many symbols as needed in the symbol sequence [A:B:C] in a symbol sequence repeater 208 and a symbol puncturer 209. The symbol sequence repeater 208 repeats the symbol sequence received from the symbol concatenator in a predetermined way. The repetition method is determined according to the code rate of the sub-code. The symbol puncturer 209 punctures or prunes as many symbols as a predetermined number, starting with the last symbol in the symbol sequence received from the symbol sequence repeater 208, to thereby create the sub-code of the QCTC. The number of punctured symbols depends on the code rate of the sub-code. Therefore, the code rate of the sub-code should be provided to the symbol sequence repeater 208 and the symbol puncturer 209 in order to perform sequence repetition and symbol puncturing. Alternatively, a higher layer controller (not shown) can calculate the number of repeated symbols and the number of punctured symbols according to a mother code rate and a sub-code rate and feed the information to the symbol sequence repeater 208 and the symbol puncturer 209.

In other words, the symbol puncturer 209 selects a predetermined number of symbols counted from a given symbol position in the symbol sequence received from the symbol sequence repeater 208, thereby generating the sub-code of the QCTC. The given symbol position refers to the symbol next to the last symbol selected for the previous transmission. Therefore, the symbol puncturer 209 can be called a "symbol selector".

The interleavers 203, 213, 223, 233 and 243, the MUXes 205 and 215, and the symbol concatenator 207 in FIG. 2 correspond to the channel interleaver 102 in FIG. 1, and the symbol sequence repeater 208 and the symbol puncturer 209 both correspond to the QCTC generator 103.

Turning back to FIG. 1, assuming a mother code rate R=⅕ and 3,072 input information symbols, channel encoder 101 outputs 15,360 codeword symbols. Hereinbelow, there will be a description of generating QCTCs with different code rates (or data rates), for example, a first QCTC $C_{0j}$ at 307.2 kbps, a second QCTC $C_{1j}$ at 614.4 kbps, and a third QCTC $C_{3j}$ at 1288.8 kbps, from the code symbols.

As described before, the 15,360 coded symbols are classified into five sub-groups, interleaved, and then rearranged as the symbol sequence of Equation (8). Then, the 15,360 coded symbols are subject to repetition according to a predetermined rule and puncturing (or pruning) according to a predetermined sub-code code rate. Thus, an intended sub-code is generated.

For a data rate of 307.2 kbps, if the sub-codes of the first QCTC $C_{0j}$ are 21,504 bits in length, the first sub-code $C_{00}$ is generated by selecting the first 21,504 symbols from the interleaved and then repeated symbol sequence. The second sub-code $C_{01}$ is generated by selecting 21,504 symbols starting with the symbol following the first sub-code $C_{00}$ from the repeated symbol sequence. The third sub-code $C_{02}$ is generated by selecting the following 21,504 symbols.

Similarly, for a data rate of 614.4 kbps, if the sub-codes of the second QCTC $C_{1j}$ are 10,752 bits in length, the first sub-code $C_{10}$ is generated by selecting the first 10,752 symbols from the interleaved symbol sequence. In other words, the first sub-code $C_{10}$ is generated by pruning all subsequent symbols following the first 10,752 symbols in the interleaved symbol sequence. The pruning is performed in the symbol puncturer 209 as stated before. The second sub-code $C_{11}$ is generated by selecting 10,752 symbols starting with the symbol following the first sub-code $C_{10}$ from the interleaved and repeated symbol sequence. The third sub-code $C_{12}$ is generated by selecting the following 10,752 symbols.

Similarly, for a data rate of 1228.8 kbps, if the sub-codes of the third QCTC $C_{2j}$ are 5,376 bits in length, the first sub-code $C_{20}$ is generated by selecting the first 5,376 symbols from the interleaved symbol sequence. The second sub-code $C_{21}$ is generated by selecting 5,376 symbols starting with the symbol following the first sub-code $C_{20}$ from the interleaved symbol sequence. The third sub-code $C_{22}$ is generated by selecting the following 5,376 symbols. In this manner, the sub-codes of the QCTC at 1228.8 kbps are generated.

The system stores information about the position of the last symbol in the previous transmitted sub-code for each QCTC. When a data rate (or code rate) for retransmission is determined, the system selects a QCTC corresponding to the data rate and generates a sub-code by selecting a predetermined number of symbols following the stored last symbol for the selected QCTC according to the data rate. If the selected symbols exceed one interleaved symbol block, the remaining symbols are selected from the following block. In this way, sub-codes are generated by repeating a block of interleaved symbols. To do so, a storing area is needed to store the repeated blocks.

Alternatively, the interleaved symbols are stored in a circular buffer memory and a sub-code is generated by selecting symbols recursively. That is, if interleaved symbols are all selected, a predetermined number of symbols are selected from the interleaved symbols starting with the first symbol. Then, the symbol repeater 208 can be omitted since the circular buffer memory functions as the symbol repeater 208.

The above embodiment of the present invention is about two-dimensional QCTCs. In the two-dimensional QCTC scheme, a QCTC corresponding to each code rate is generated independently and the sub-codes of the QCTC are sequentially transmitted. However, the two-dimensional QCTCs are not optimum for the reasons described below.

As shown in FIG. 2, it is assumed that the first sub-code $C_{00}$ of the first QCTC $C_{0j}$ is used for initial transmission, the first sub-code $C_{10}$ of the second QCTC $C_{1j}$ is used for the next transmission, and the first sub-code $C_{20}$ of the third QCTC $C_{2j}$ is used for the third transmission. Then, a receiver decodes data by combining the three sub-codes ($C_{00}$, $C_{10}$, $C_{20}$). In this case, however, the code combining does not recover an original code with a code rate of ⅕, only to increase the symbol energy of information symbols and thus to decrease decoding performance. This implies that there is a problem with the transmission order of the sub-codes, that is, selection of the sub-codes. To overcome the problem, adaptive QCTCs are proposed. In the adaptive QCTC scheme, the number of code symbols to be selected is determined according to the code rate of a sub-code and the sub-code is generated by selecting the determined number of symbols starting with the symbol following the last symbol used for the previous transmission.

Figure 3:
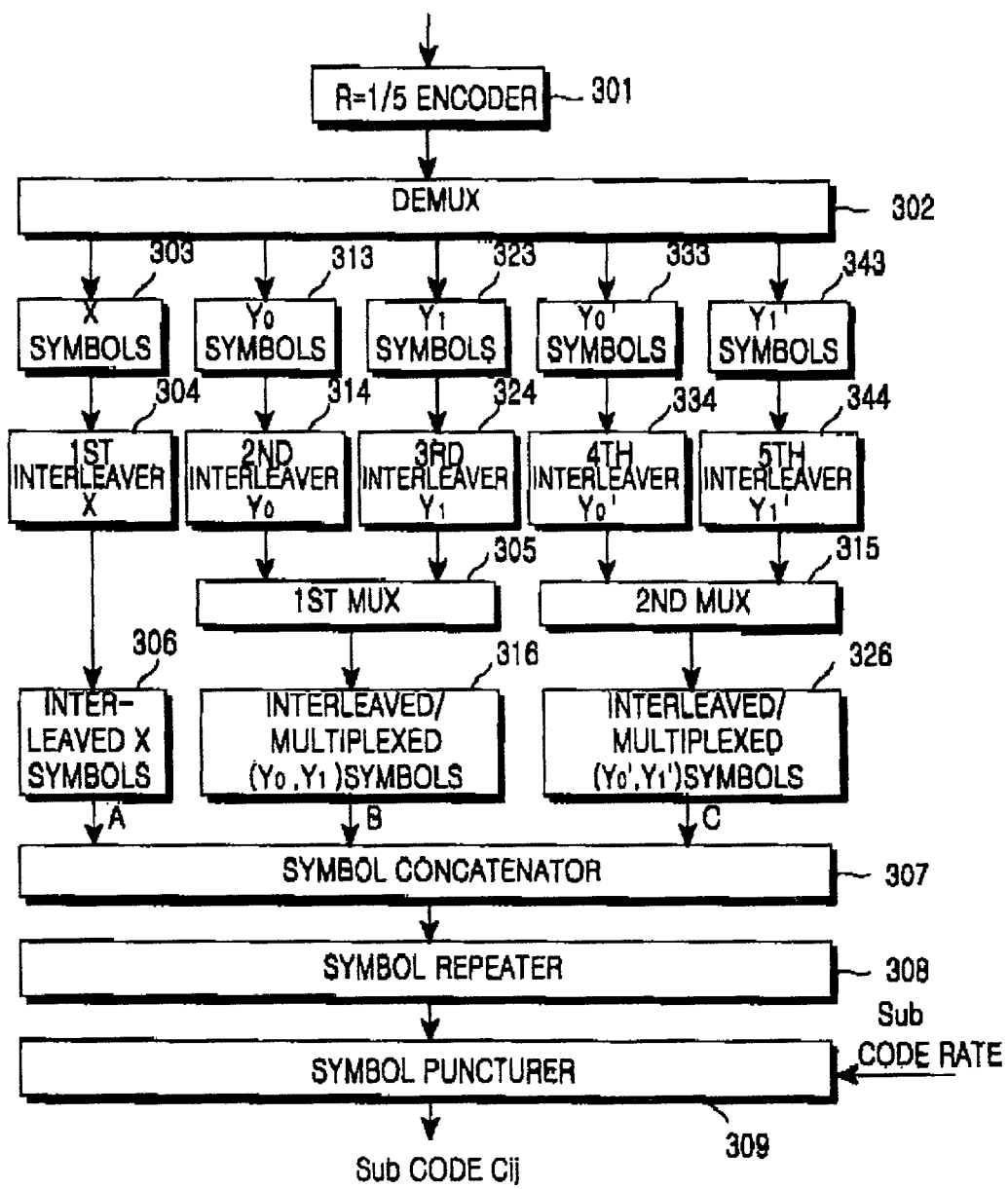
FIG. 3 illustrates a method for selecting sub-codes of a quasi-complimentary turbo code according to an embodiment of the present invention.

FIG. 3 is a block diagram of another embodiment of the QCTC generating apparatus. The structure shown in FIG. 3 is the same as that shown in FIG. 2 except that the symbol sequence repeater and the symbol puncturer operate in different manners. Therefore, the following description is made mainly of the symbol sequence repeater 308 and the symbol puncturer 309.

The symbol sequence repeater 308 repeats a symbol sequence received from a symbol concatenator 307 in a predetermined way. The repetition may be carried out according to a given parameter in the symbol sequence repeater 308, or under the control of a higher layer controller (not shown), or upon request of the symbol concatenator 307. The above process is implemented in the same manner as described referring to FIG. 2. Then, the symbol puncturer 309 punctures symbols received from the symbol sequence repeater 308 according to a different rule from the rule applied in FIG. 2 to generate a sub-code. The puncturing rule is as follows.

It is assumed that transmission starts at time k, a sub-code transmitted at time (k+h) is expressed as $C_{1j}(k+h)$, and the code symbols of a mother code with R=⅕ are $C_m(0)$, $C_m(1)$, . . . , $C_m(N-1)$. The number of the code symbols, N, is defined as L_INF×5 since the mother code rate is ⅕. Here, L_INF denotes the size of a sub-block interleaver, or the number of information symbols.

Step 1: The Length of an Initial Sub-Code is Determined.

For an initial transmission, one $C_{i0}$ of the first sub-codes $C_{00}$, $C_{10}$, $C_{20}$ of available QCTCs is selected according to a given code rate and the length of the selected sub-code $C_{i0}$ is stored as a variable L_SC. The code rate or length L_SC of the sub-code is predetermined in the system according to channel environment including transmission channel condition and input data rate. The description is made in the context of three QCTCs shown in FIG. 3 for better understanding of the present invention, but, the number of sub-codes is not limited to the same number.

Step 2: A Sub-code for Initial Transmission is Selected and Transmitted.

After the length of a sub-code to be transmitted is determined, $C_m(0)$, $C_m(1)$, . . . , $C_m(L\_SC-1)$ are selected among the code symbols of the mother code. If L_SC exceeds N, $C_m(0)$, $C_m(1)$, . . . , $C_m(N)$ are transmitted P times and then $C_m(0)$, $C_m(1)$, . . . , $C_m(q-1)$ are transmitted. Here, P and q are the quotient and remainder of L_SC/N, respectively and P and q are calculated by L_SC mod N. Then, the variable q is stored for the next transmission for use in detecting the position of the last symbol of the previous transmitted sub-code with respect to the block of interleaved symbols.

Step 3: The Starting Position of a Sub-code for the Next Transmission and the Length of the Sub-code are Determined.

For the next transmission, the code rate R_SC of a new sub-code to be transmitted is determined according to channel environment and the length L_SC of the sub-code is determined according to the determined code rate. The length L_SC and the code rate R_SC is in the relation of $$L\_SC = L\_INF \times (1/R\_SC) \qquad (9)$$

A higher layer system transmits the sub-code length L_SC and the sub-code code rate R_SC to the symbol puncturer 308 for each transmission.

Step 4: A Sub-code for the Next Transmission is Selected and Transmitted.

After the length L_SC of the sub-code to be transmitted is determined, $C_m(q)$, $C_m(q+1)$, . . . , $C_m(q+L\_SC-1)$ code symbols are selected among the code symbols of the mother code. In other words, as many symbols as the sub-code length are selected from the mother code symbols starting with the symbol following the last symbol selected for the previous transmission. If q+L_SC exceeds N, a row comprised of N code symbols starting with $C_m(q)$ are selected recursively and transmitted P times and then the remaining q' code symbols are sequentially transmitted. Here, P and q' are the quotient and remainder of (L_SC)/N, respectively and the q' is calculated by (q+L_SC) mod N. Then, the next symbol position value of the position of the last selected symbol for the next transmission is stored to the q. The variable q is the next symbol position of the last symbol position among symbols comprised of the last transmitted sub-code. After the generated sub-code is transmitted, the procedure returns to step 3.

The transmission of adaptive QCTCs will be made clear with cases shown in FIG. 3. Referring to FIG. 3, a low rate sub-code with a code rate of ⅐ is initially transmitted in Case 1, and a high rate sub-code with a code rate of 4/7 is initially transmitted in Case 2. As seen from the cases, N (=15,360) successive mother code symbols are repeated and as many code symbols as a size corresponding to the length of a sub-code to be transmitted (or the code rate of the sub-code) are selected sequentially at each transmission from the repeated mother code symbols.

In real implementation, a buffer is not used to store (P−1) times repeated-mother codes, but a single circular buffer is employed to store N code symbols and recursively select code symbols to thereby generate a sub-code of an intended length. That is, use of the circular buffer memory obviates the need of sequence repetition. Any reception buffer is available to a receiver as long as it can store N soft metrics for code combining.

Next, a description will be made of a method for receiving the data transmitted by the above transmission technique, and a method for realizing the respective function blocks of FIG. 3.

Figure 4:
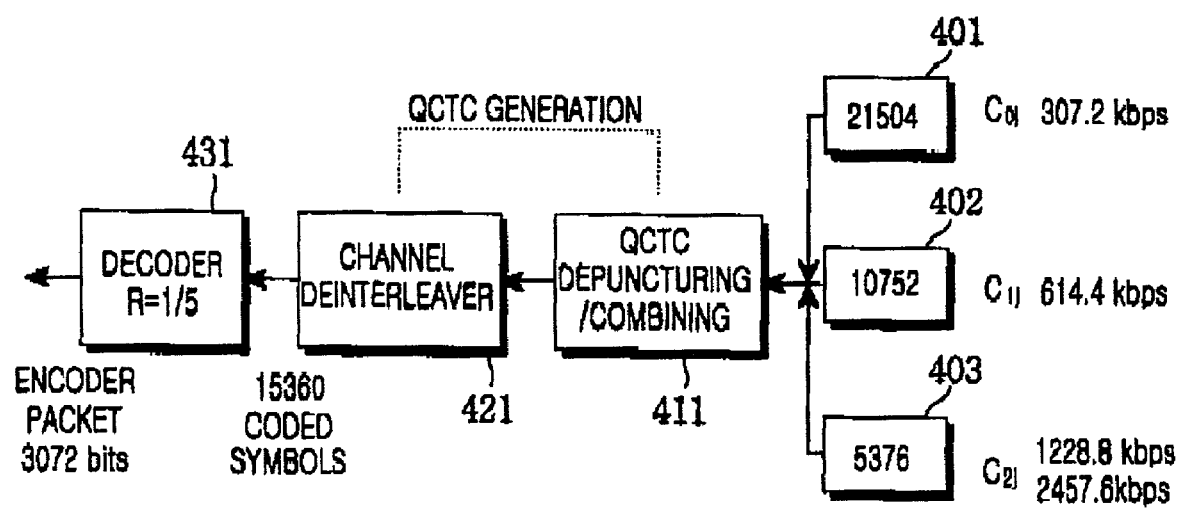
FIG. 4 illustrates a structure of a receiver for receiving data transmitted by the transmitter of FIG. 1 according to an embodiment of the present invention.

FIG. 4 illustrates a structure of a receiver for receiving data transmitted by the transmitter of FIG. 1. Referring to FIG. 4, data signals 401, 402 and 403 transmitted by the transmitter at their associated data rates are sub-codes $C_{1j}$ of the QCTC. The received data signals 401, 402 and 403 are provided to a QCTC processor (QCTC depuncturing/combining) 411. QCTC processor 411 performs depuncturing on the received signals to convert the received signals to turbo codes with its original code rate R from the sub-codes based on the characteristic of the QCTC, and also performs soft combining on the received sub-codes. The "depuncturing" is a process for inserting erasure symbols in the positions of the punctured symbols. Chase combining may be used for the soft combining of the received sub-codes. As mentioned with reference to the characteristic of the QCTC, the receiver generates code symbols with a code rate R by soft combining the sub-codes $C_{ij}$ transmitted from the transmitter.

Herein, the receiver will be described on the assumption that the code rate R=⅕, as in the transmitter where the code rate is R=⅕. The received sub-codes $C_{1j}$ are equally rearranged and soft-combined by the receiver according to the $C_{ij}$ transmission rule. This process will be described in detail herein below. Further, since the soft combining has different metric qualities according to the number of bits per received symbol, the present invention regards even the hard combining as soft combining having a 1-bit resolution. Actually, since the performance is not remarkably improved by the hard combining, the soft combining will be described herein. A detailed description of this will be provided along with a description of the respective function blocks in the receiver.

The QCTC processor 411 generates N soft-combined codeword symbols originally generated by the encoder by depuncturing and soft combining, and transmits them to a channel deinterleaving block 421. The soft-combined codeword symbols are sample values generated from the received codeword symbols expressed by a plurality of bits or real numbers, and herein, N represents the number of codeword symbols output from the encoder used in the transmitter. The channel deinterleaving block 421 channel-deinterleaves the soft-combined codeword symbols received from the QCTC processor 411, and transmits N deinterleaved, soft-combined codeword symbols to a channel decoder 431. The channel decoder 431 decodes the N deinterleaved, soft-combined codeword symbols, and outputs N×R information symbols. Here, R is a code rate of the encoder used in the transmitter.

Figure 5:
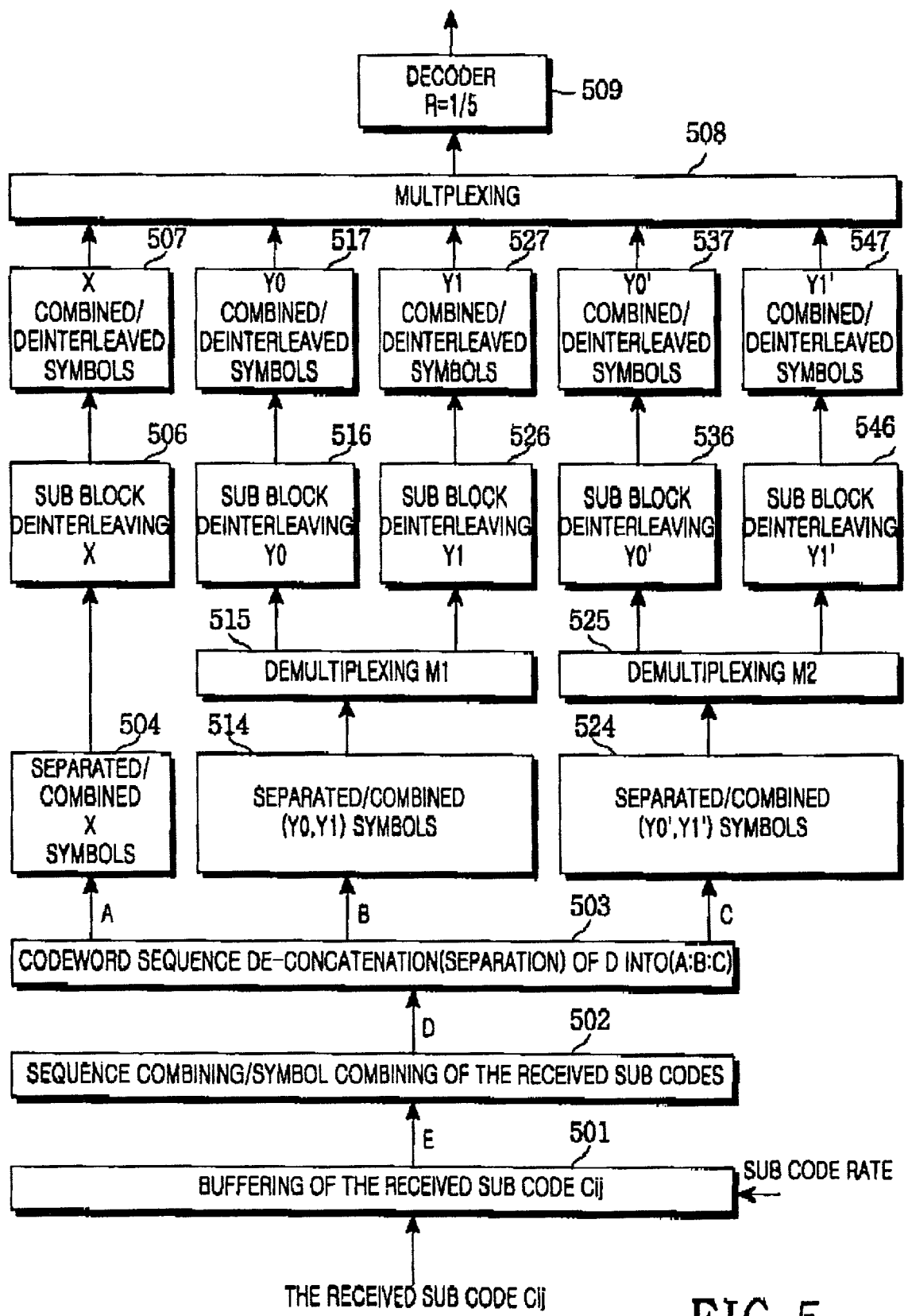
FIG. 5 is a functional block diagram of a procedure for processing the received signals in the receiver according to an embodiment of the present invention.

FIG. 5 illustrates a functional block diagram of a procedure for processing the received signals in the receiver according to an embodiment of the present invention. A structure and operation of the respective function blocks will be described in detail with reference to FIG. 5.

Referring to FIG. 5, a reception sub-code buffer (buffering of the received sub-codes $C_{1j}$) 501 stores the sub-codes Cij received from the transmitter. A size of the buffer depends on the number N of the codeword symbols, and if Q bits are used per one received symbol, a Q×N-bit memory is used for the reception sub-code buffer 501. Further, information on the type of the sub-code received at every instant and a transmission start point of the sub-codes of an R=⅕ codeword can be recognized by the receiver through a control channel or a control message transmitted along with the sub-codes. The received symbols are stored in association with the sub-codes by previously transmitting the information to the reception sub-code buffer 501. A method for storing the received symbols in a buffer with N storages will be described in detail with reference to FIG. 7.

A sequence combiner/symbol combiner (sequence combining/symbol combining of the received sub-codes with puncturing) 502 performs a reverse process of the sequence repetition and symbol puncturing performed by the symbol repeater 308 and the symbol puncturer 309 of the transmitter, at the same time when the reception process is performed. That is, the reception sub-code buffer 501 soft-combines the previously received symbols with the symbols received from the current channel. If the number of the received code symbols of the respective sub-codes is less than N, it means that the transmitter has used puncturing. In this case, the reception sub-code buffer 501 inserts erasure symbols in the corresponding positions of the codeword symbols before soft combining. When Chase combing is used for the sequence combining, the reception sub-code buffer 501 applies different weights to the codeword of the previously received symbols and the codeword of the symbols received from the current channel, before soft combining. If it is assumed that the weight of the codeword of the previously received symbols stored in the reception sub-code buffer 501 is represented by w1 and the weight of the codeword of the symbols received from the current channel is represented by w2, the weights w1 and w2 are applied to the respective soft metrics for combining. The weights are given by a channel estimator in the receiver. A Chase algorithm for the sequence (or codeword) soft combining is well known, so a detailed description of this will be avoided for simplicity. Finally, the sequence combiner/symbol combiner 502 generates soft metrics for the N codeword symbols, and transmits them to a codeword separator (codeword sequence de-concatenation or separation into (A:B:C)) 503. In FIG. 5, the soft metrics for the N codeword symbols output by sequence combiner/symbol combiner 502 are represented by 'D', for the sake of convenience.

The codeword deconcatenator 503 separates the soft metrics for the N soft-combined codeword symbols into an information symbol part X, a first parity symbol part $Y_0, Y_1$ and a second parity symbol part $Y_0', Y_1'$. Demultiplexers M1 (515) and M2 (525) demultiplex the first parity symbol part $Y_0, Y_1$ and the second parity symbol part $Y_0', Y_1'$, respectively, thereby to rearrange them in an information symbol part X, a demultiplexed first parity symbol part $Y_0, Y_1$, and a demultiplexed second parity symbol part $Y_0', Y_1'$. This operation can be performed either sequentially or simultaneously. Next, the information symbol part X, the demultiplexed first parity symbol part $Y_0, Y_1$, and the demultiplexed second parity symbol part $Y_0', Y_1'$ are separated again into a stream of 5 codeword symbols X, $Y_0$, $Y_0'$, $Y_1$, and $Y_1'$, and then transmitted to sub-block deinterleaving blocks 506, 516, 526, 536 and 546, respectively.

The sub-block deinterleaving blocks perform a reverse process of the sub-block interleaving performed in the transmitter, on the N*R=5 (where R=⅕) codeword symbol streams X, $Y_0$, $Y_0'$, $Y_1$, and $Y_1'$. The sub-block deinterleaving can be realized either such that the 5 codeword symbols can be deinterleaved by deinterleaving one sub-block, or such that the codeword symbols can be independently deinterleaved by as many deinterleavers as the number of the codeword symbols. A description of the present invention is not limited to realization of specific sub-block interleaving, but given on the assumption that a reverse process of the sub-block interleaving generally used in the transmitter is performed by the sub-block deinterleaving blocks in the receiver.

The 5 combined/deinterleaved symbols (507, 517, 527, 537 and 547) are subject to multiplexing 508 where they are recombined in a reverse process as performed by DEMUX 302 in the transmitter. Finally, a decoder 509 decodes the soft metrics for the N codeword symbols provided from the sub-block deinterleaving blocks, and outputs transmitted information symbols, i.e., an encoded packet.

Figure 6:
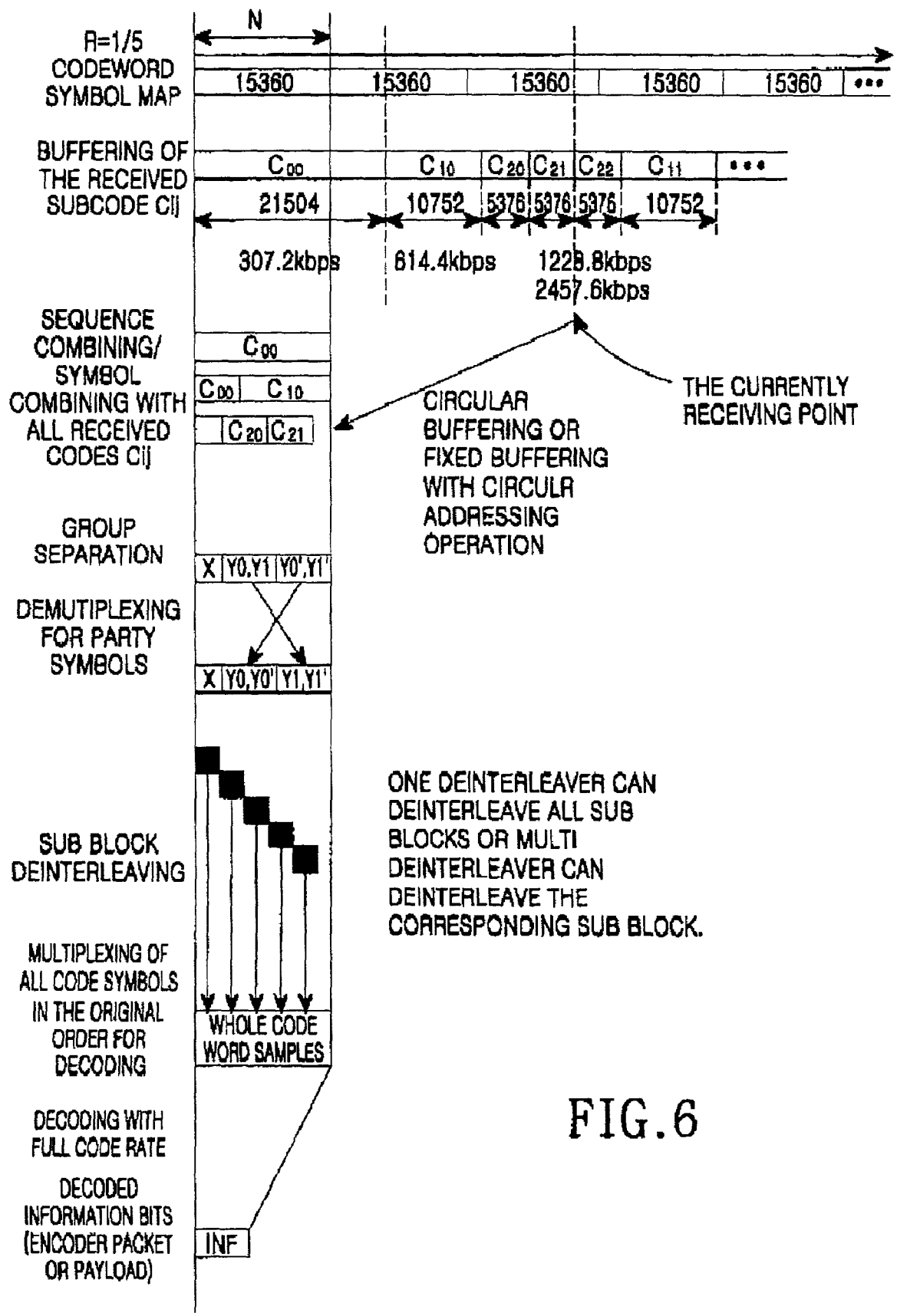
FIG. 6 illustrates a procedure for processing the received data in the receiver according to an embodiment of the present invention.

The procedure performed by the respective function blocks in the receiver is shown in FIG. 6. As illustrated in FIG. 6, it will be assumed that the sub-codes transmitted up to the present by the transmitter are $C_{00}$, $C_{10}$, $C_{20}$ and $C_{21}$. That is, $C_{00}$ is a sub-code having 21,504 codeword symbols, $C_{10}$ is a sub-code having 10,752 codeword symbols, and $C_{20}$ and $C_{21}$ are sub-codes each having 5,376 codeword symbols. Therefore, up to the present, the receiver has received a total of 4 sub-codes, all of which were transmitted as sub-codes having different sub-code code rates by one 3,072-bit encoded packet, an information block. Thus, the receiver should generate the soft metrics for the N codewords by soft combining the sub-codes in the above manner. Thus, as shown in FIG. 6, the receiver soft-combines the 4 sub-codes such that the positions of 15,360 (=3,072×5) codeword symbols of an R=⅕ codeword should be identical to the positions of the codeword symbols of each sub-code. Also, as illustrated in FIG. 6, since the $C_{00}$ with a sub-code length 21,504 is longer than N in length (i.e. 15,360), the receiver sequentially arranges the 6,144 (=21,504−15,360) codeword symbols remaining after arranging the 15,360 symbols as in the sequence repetition method, starting again from the beginning, and then soft-combines the arranged codeword symbols. Similarly, since the $C_{10}$ was transmitted following the $C_{00}$ by the transmitter in the above transmission method, it is also stored following the end of the $C_{00}$ at the receiver and then soft-combined. Likewise, since the $C_{20}$ and $C_{21}$ were transmitted following the $C_{10}$ by the transmitter in the above transmission method, they are also stored following the end of the $C_{10}$ at the receiver and then soft-combined.

Figure 7:
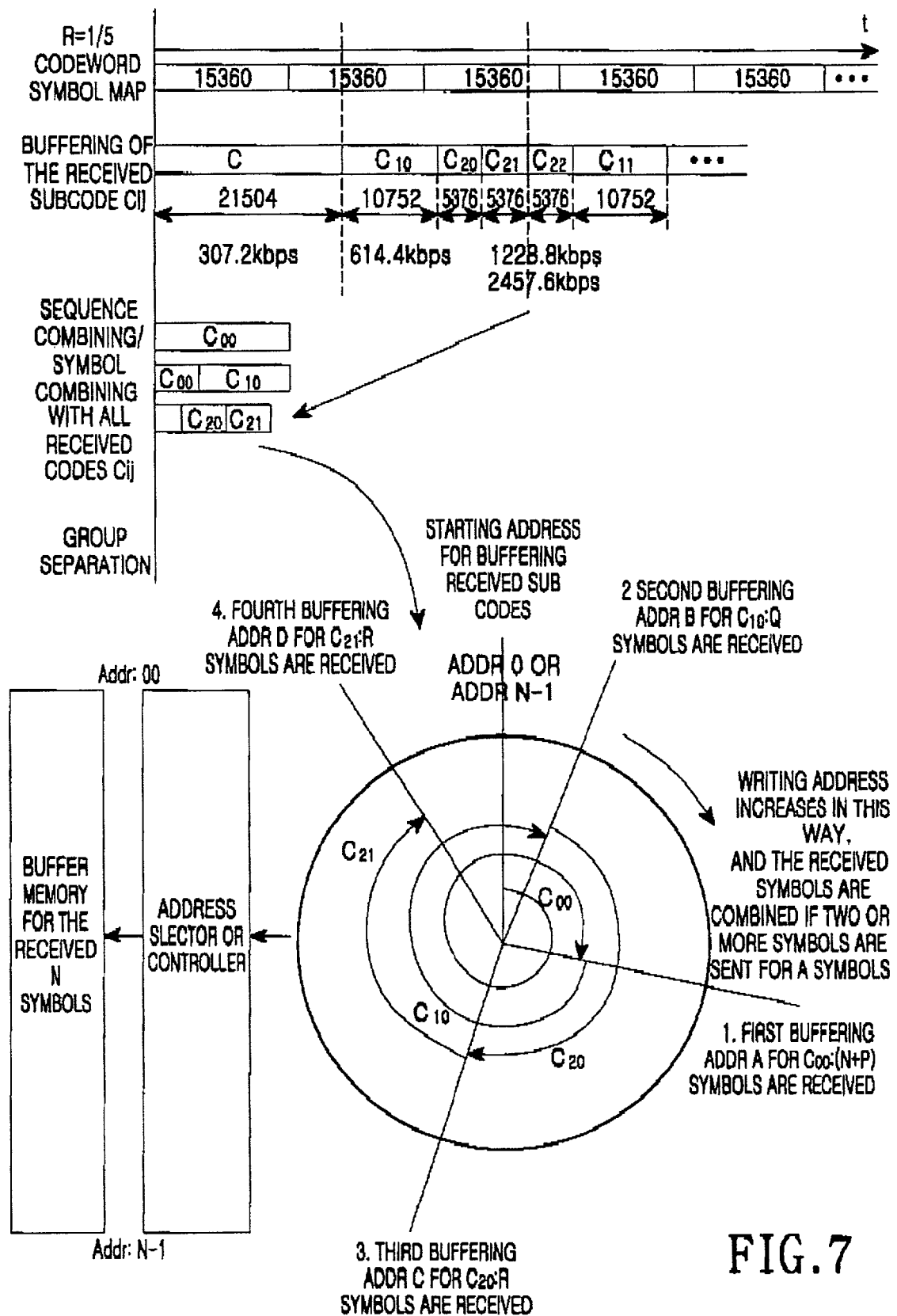
FIG. 7 illustrates a procedure for separating received data, storing the separated data and decoding the data in the receiver according to an embodiment of the present invention.

This operation will be described in more detail with reference to FIG. 7. As shown in FIG. 7, the receiver can use N or N×Q bit buffers to realize a rotational buffer, or use a buffer memory with a fixed size and design a buffer address generator to generate rotational addresses. Also, as shown in FIG. 7, the $C_{00}$ stores N symbols beginning at a starting address addr:00 and thereafter stores 6,144 (=21,504−15,360) symbols in a buffer. Since it is a step of storing the symbols after storing the N symbols, the symbols are soft-combined with the previously stored symbols in the above method. Let an address where the part of the soft combining is completed be addr_A. Then, if the $C_{10}$ is equally received next, the received symbols are stored in the buffer by advancing by 10,752 bits from the addr_A. Since it is also the step of storing the symbols after storing the N symbols, the symbols are soft-combined with the previously stored symbols in the above method. Let an address where this part of the soft combining is completed be addr_B. Then, if the $C_{20}$ is received next, the received symbols are stored in the buffer by advancing by 5,376 bits from the addr_B. Let an address where the part of the soft combining is completed be addr_C. Then, if the $C_{21}$ is received next, the received symbols are stored in the buffer by advancing by 5,376 bits from the addr_C. Let an address where this part of the soft combining is completed be addr_D. Then the receiver continuously performs soft combining on the sub-codes transmitted by one encoded packet in the above method and generates soft metrics for a total of N codeword symbols after completing this process. This method can be regarded as a method of realizing the sub-code generating method for the QCTC in the transmitter. Summarizing, the method includes Step 1 of determining a length of an initial sub-code, Step 2 of determining and transmitting a sub-code to be initially transmitted, Step 3 of determining a position of a code symbol to be transmitted next and determining a transmission length, and Step 4 of determining and transmitting a sub-code to be transmitted next. Accordingly, the receiver can soft combine the sub-codes in association with R=⅕codewords based on information on the type of the sub-codes transmitted by the transmitter in the rotational buffering method.

Referring again to FIG. 6, the codeword separator separates the soft metrics for the N soft-combined codeword symbols into an information symbol part X, a first parity symbol part $Y_0, Y_1$, and a second parity symbol part $Y_0', Y_1'$, Group Separation. Thereafter, the demultiplexer M1 (515) and M2 (525) demultiplex the first parity symbol part $Y_0, Y_1$ and the second parity symbol part $Y_0', Y_1'$, respectively, thereby to rearrange them in an information symbol part X, a demultiplexed first parity symbol part $Y_0, Y_1$, and a demultiplexed second parity symbol part $Y_0', Y_1'$. This operation can be performed either sequentially or simultaneously. Next, the information symbol part X, the demultiplexed first parity symbol part $Y_0, Y_1$, and the demultiplexed second parity symbol part $Y_0', Y_1'$ are separated again into a stream of 5 codeword symbols X, $Y_0$, $Y_0'$, $Y_1$, and $Y_1'$, and then transmitted to sub-block deinterleaving blocks 506, 516, 526, 536 and 546, respectively.

The sub-block deinterleaving blocks perform a reverse process of the sub-block interleaving performed in the transmitter, on the N*R=5 codeword symbol streams X, $Y_0$, $Y_0'$, $Y_1$, and $Y_1'$. The sub-block deinterleaving can be realized either such that 5 codeword symbols can be deinterleaved by deinterleaving one sub-block, or such that the codeword symbols can be independently deinterleaved by as many deinterleavers as the number of the codeword symbols. A description of the present invention is not limited to realization of specific sub-block interleaving, but given on the assumption that a reverse process of the sub-block interleaving generally used in the transmitter is performed by the sub-block deinterleaving blocks in the receiver.

Finally, the decoder decodes the soft metrics for the N codeword symbols provided from the sub-block deinterleaving blocks, and outputs transmitted information symbols, i.e., an encoded packet.

As described above, the communication system according to the present invention can generate complementary turbo codes and quasi-complementary turbo codes. The communication system can drastically improve its throughput by applying the complementary turbo codes to the ARQ scheme.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for receiving a quasi-complementary turbo code (QCTC) and decoding the QCTC, comprising:
    a combiner for sequence combining received symbols;
    a channel de-interleaver for separating the combined symbols into an information symbol stream and parity symbol streams, demultiplexing the parity symbol streams into at least one parity symbol stream according to a given code rate, and independently de-interleaving and outputting the information symbol stream and the demultiplexed parity symbol streams; and
    a turbo code decoder for multiplexing the independently de-interleaved parity symbol streams and the de-interleaved information symbol stream, decoding the multiplexed streams according to a predetermined decode rate, and outputting the information symbol stream.

2. The apparatus as claimed in claim 1, wherein the channel deinterleaver comprises:
    a separator for separating an output of the combiner into an information symbol stream and at least one parity symbol stream;
    at least one demultiplexer for demultiplexing the parity symbol streams output from the separator into parity symbol stream pairs; and
    at least one deinterleaver for independently deinterleaving outputs of the demultiplexers and the information symbol stream.

3. The apparatus as claimed in claim 1, wherein the combiner comprises:
    a circular buffer memory for storing the received symbols; and
    a sequence/symbol combiner for selecting and outputting a predetermined number of symbols stored in the circular buffer memory, according to a code rate from a starting position.

4. The apparatus as claimed in claim 3, wherein the starting position of the circular buffer memory is the symbol next to the last symbol of the finally transmitted symbols whenever each symbol stream is received.

5. The apparatus as claimed in claim 3, wherein the sequence/symbol combiner combines the received symbols with the previous transmitted symbol and outputs a combined symbol to the channel de-interleaver if there is a retransmission symbol of the received symbol.

6. The apparatus as claimed in claim 5, wherein the combiner performs a soft combining.

7. The apparatus as claimed in claim 5, wherein the combiner performs a hard combining.

8. A method for receiving quasi-complementary turbo code (QCTC) and decoding the QCTC, comprising the steps of:
   (a) sequence combining received symbols;
   (b) separating the combined symbols into an information symbol stream and parity symbol streams, demultiplexing the parity symbol streams into at least one parity symbol stream according to a given code rate, and independently de-interleaving and outputting the information symbol stream and the demultiplexed parity symbol streams; and
   (c) multiplexing the independently de-interleaved parity symbol streams and the de-interleaved information symbol stream, decoding the multiplexed streams according to a predetermined decode rate, and outputting the information symbol stream.

9. The method as claimed in claim 8, wherein the step (b) comprises the steps of:
   (a) separating and outputting the information symbol stream and the parity symbol streams from the combined symbols;
   (b) demultiplexing the parity symbol streams; and
   (c) independently de-interleaving the demultiplexed parity symbol streams and the information symbol stream.

10. The method as claimed in claim 8, wherein the step (a) comprises the steps of:
    circularly storing the received symbols; and
    selecting and outputting a predetermined number of symbols of symbols circularly stored, according to a code rate from the starting position.

11. The method as claimed in claim 10, wherein in the step (a) the starting position of the circularly stored symbols is the symbol next to the last symbol of the finally transmitted symbols whenever each symbol stream is received.

12. The method as claimed in claim 10, wherein step (b) comprises combining the previous transmitted symbol with outputs to the channel de-interleaver if there is a retransmission symbol of the received symbol.

13. The method as claimed in claim 12, wherein the combination is a soft combination.

14. The method as claimed in claim 12, wherein the combination is a hard combination.

15. The method as claimed in claim 8, wherein in the step (b) the information symbols and a plurality of parity symbol streams are de-interleaved respectively, independently by PBRO (Partial Bit Reversal Order) De-interleaving method.

16. The apparatus as claimed in claim 1, further comprising a depuncturer for depuncturing the received symbols according to a code rate.

* * * * *